United States Patent
Iwai et al.

(10) Patent No.: US 7,517,557 B2
(45) Date of Patent: Apr. 14, 2009

(54) OXIDE FILMS, A METHOD OF PRODUCING THE SAME AND STRUCTURES HAVING THE SAME

(75) Inventors: Makoto Iwai, Kasugai (JP); Makoto Ohmori, Nagoya (JP); Takashi Yoshino, Aichi-prefecture (JP); Minoru Imaeda, Aichi-prefecture (JP)

(73) Assignee: NGK Insulators, Ltd., Nagoya (JP)

( * ) Notice: Subject to any disclaimer, the term of this patent is extended or adjusted under 35 U.S.C. 154(b) by 863 days.

(21) Appl. No.: 10/792,852

(22) Filed: Mar. 5, 2004

(65) Prior Publication Data

US 2009/0074963 A1    Mar. 19, 2009

(30) Foreign Application Priority Data

Mar. 10, 2003   (JP)   ............... P 2003-63418

(51) Int. Cl.
C23C 16/00     (2006.01)
B01F 3/02      (2006.01)

(52) U.S. Cl. ............. 427/248.1; 118/719; 48/189.4; 427/255.23

(58) Field of Classification Search ........... 427/248.1, 427/250

See application file for complete search history.

(56) References Cited

U.S. PATENT DOCUMENTS 4,699,675 A * 10/1987 Longeway ............ 117/84
6,037,439 A * 3/2000 Serizawa et al. ........... 528/241

FOREIGN PATENT DOCUMENTS

| JP | A 3-75207 | 3/1991 |
| JP | A-3-253295 | 11/1991 |
| JP | A 4-119906 | 4/1992 |

(Continued)

OTHER PUBLICATIONS

Journal of Crystal Growth 148 (1995), "Preparation of lithium niobate films by metalorganic chemical vapor deposition with a lithium alkoxide source", Akira Tanaka et al., pp. 324-326.

(Continued)

*Primary Examiner*—Timothy Meeks
*Assistant Examiner*—Kelly M. Stouffer
(74) *Attorney, Agent, or Firm*—Oliff & Berridge, PLC

(57) ABSTRACT

An object of the present invention is to produce an oxide film having good surface morphology and crystal quality, by a metal organic chemical vapor deposition using two or more raw material gases of metal organic compounds and oxygen gas. It is used a film forming system having a first supply hole 11A, a second supply hole 11B, a third supply hole 11C and a film forming chamber 7. A first raw material gas "A" containing a first metal organic compound is supplied through the first supply hole 11A into the chamber 7. A second raw material gas "B" containing the second metal organic compound is supplied through the second supply hole 11B into the chamber 7, and oxygen gas "C" is supplied through the third supply hole 11C into the chamber 7. The oxygen gas "D" contacts the first raw material gas "E" before the oxygen gas is mixed with the second raw material gas "F" in the chamber 7.

6 Claims, 3 Drawing Sheets

FOREIGN PATENT DOCUMENTS

| | | |
|---|---|---|
| JP | A 7-90587 | 4/1995 |
| JP | A-8-73222 | 3/1996 |
| JP | A 10-45490 | 2/1998 |
| JP | A 2001-343544 | 12/2001 |

OTHER PUBLICATIONS

Jpn. J. Appl. Phys., vol. 38 (1999), "Preparation and Characterization of Epitaxial $LiNbO_3$ Thin Films by Metal-Organic Chemical Vapor Deposition", Kosuke Shiratsuyu et al., pp. 5437-5441.

* cited by examiner

OXIDE FILMS, A METHOD OF PRODUCING THE SAME AND STRUCTURES HAVING THE SAME

This application claims the benefit of Japanese Patent Application P 2003-63418 filed on Mar. 10, 2003, the entirety of which is incorporated by reference.

BACKGROUND OF THE INVENTION

1. Field of the Invention

The present invention provides a method of producing an oxide film by a metal organic chemical vapor deposition.

2. Related Art Statement

Single crystals of potassium lithium niobate and potassium lithium niobate-potassium lithium tantalate solid solution have attracted much attention as single crystals for a second harmonic generation (SHG) device generating a blue light used for a semiconductor laser. The single crystal mentioned above is capable of generating an ultraviolet ray. By utilizing such a short wave light, the single crystal mentioned above can thereby be applied in various fields such as optical disc memory, DVD laser light source, laser pointer, display, medical science, photo-chemistry and various kinds of light measurements. In addition, since the single crystal mentioned above has a large electro-optic effect, it can be applied for an optical memory device and so on utilizing its photorefractive effect.

On the other hand, a film-forming process by a metal organic chemical vapor deposition is disclosed in "Jpn. J. Appl. Phys." Vol. 38, (1999) pages 5437 to 5441 and Japanese patent publication 8-73222A. According to the process, raw material gases for lithium and niobium and oxygen gas are mixed in a container and the thus mixed gas is then introduced into a reactor to proceed the chemical reaction in the reactor. A film of lithium niobate is thus deposited on a substrate in the reactor.

Further, according to "J. Crystal Growth" 148, (1995), pages 324 to 326, raw materials for lithium and niobium are mixed and the resulting mixed gas is then introduced into a reactor to form a film of lithium niobate.

Japanese patent 3, 253, 295 disclosed a method of producing an oxide superconductor by a metal organic chemical vapor deposition. According to the method, raw material gases for metal elements constituting the oxide superconductor are supplied into a reactor through the corresponding supply holes while each pressure of the gas is controlled. The raw material gases are mixed and reacted in the reactor.

SUMMARY OF THE INVENTION

The present inventors have studied a method of producing a relatively complex oxide such as potassium lithium niobate single crystal by a metal organic chemical vapor deposition. Gases of an organic lithium compound, an organic potassium compound, an organic niobium compound and oxygen were mixed and introduced into a reactor for forming a film of, for example, potassium lithium niobate. It was, however, proved that a film having excellent surface morphology could not be obtained in such oxide of a complex composition.

An object of the present invention is to produce an oxide film having good surface morphology and crystal quality, by a metal organic chemical vapor deposition using two or more raw material gases containing metal organic compounds and oxygen gas.

The present invention provides a method of producing an oxide film on a substrate by a metal organic chemical vapor deposition using a film forming system having a first supply hole, a second supply hole, a third supply hole and a film forming chamber. According to the method, a first raw material gas containing a first metal organic compound is supplied through the first supply hole into the chamber, a second raw material gas containing the second metal organic compound is supplied through the second supply hole into the chamber, and oxygen gas is supplied through the third supply hole into the chamber to form an oxide film. The oxygen gas contacts the first raw material gas before the oxygen gas is mixed with the second raw material gas in the chamber.

The present invention further provides an oxide film produced by the method.

The present invention still further provides a structure having a substrate and the oxide film.

The inventors have studied the cause of the deterioration of surface morphology and crystal quality of an oxide film described above and found the followings. That is, when a plurality of raw material gases are supplied into a film-forming chamber with oxygen gas, the raw material gases decompose usually at different temperatures. When the raw material gases are mixed and the resulting mixed gas is introduced into the chamber, the degree of decomposition is different among the raw material gases in the chamber. It is thus impossible to form a good film.

The inventors have thus tried to heat the raw material gases at the respective temperatures appropriate for the decomposition and to introduce the decomposed gases into a film-forming chamber before mixing. The introduced gases are then reacted with oxygen gas separately introduced into the chamber. Even in this case, however, when the film formation process was performed, the surface morphology of the film was degraded. It is considered that the degree of decomposition of the gas is deviated in the chamber. The reasons may be speculated as follows. If the raw material gases are heated at the respective appropriate temperatures before the gases are introduced into the chamber, the degree of decomposition of each gas is difficult to control and tends to be substantially deviated in the chamber.

The inventors have thus tried to supply the raw material gases through separate inlets into the film-forming chamber and to make oxygen gas contact with a first raw material gas having a higher decomposition temperature before the other raw material gases. The first raw material gas, which is relatively difficult to decompose, is contacted with oxygen gas before the oxygen contacts with the other gases so that the decomposition is enhanced in the chamber. Oxygen gas is contacted and mixed with the first raw material gas, and then contacted and mixed with a second raw material gas right after that. A composite oxide derived from the raw material gases is then deposited on a specific target (substrate).

These and other objects, features and advantages of the invention will be appreciated upon reading of the following description of the invention when taken in conjunction with the attached drawings, with the understanding that some modifications, variations and changes of the same could be easily made by the skilled person in the art.

PREFERRED EMBODIMENTS OF THE INVENTION

Figure 1:
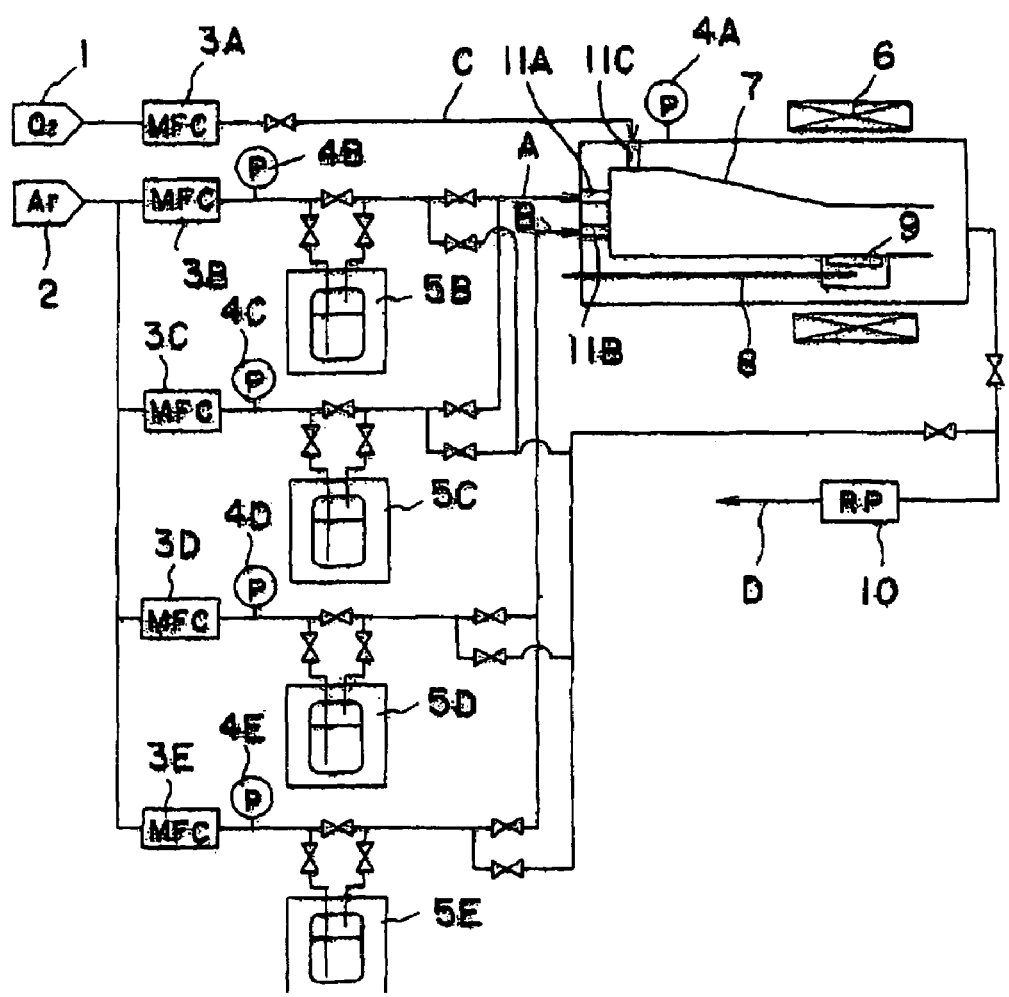
FIG. 1 is a block diagram schematically showing a film forming system usable in the present invention.

According to the present invention, a film forming system is used having a first supply hole, a second supply hole, a third supply hole and a film forming chamber. The shape or construction of the film forming system is not particularly limited.

The first and second metal organic compounds are decided depending on a target composition of an oxide and thus not particularly limited. The present invention includes a case where three or more kinds of metal organic compounds are used.

In a preferred embodiment, the oxide film is made of a single crystal having an electro-optic effect. Although the kind of such single crystal is not particularly limited, the oxide may preferably selected from the group consisting of lithium niobate, lithium tantalate, lithium niobate-lithium tantalate solid solution, potassium lithium niobate, potassium lithium tantalate, potassium lithium niobate-potassium lithium tantalate solid solution, potassium niobate and potassium tantalate-potassium niobate solid solution.

It may be added to an oxide single crystal having electrooptic effect, as a dopant, one or more metal element selected from the group consisting of magnesium (Mg), zinc (Zn), scandium (Sc) and indium (In), for improving the resistance against optical damage. Magnesium is most preferred among them.

Single crystals having electro-optic effect may contain a dopant of one or more rare earth element. The doped earth element may function as an additive for laser oscillation. The doped rare earth element may preferably be Nd, Yb, Er, Tm, Ho, Dy and Pr.

Further in a preferred embodiment, the oxide constituting the oxide film is composed of a crystal having tungsten-bronze structure containing at least lithium, potassium, oxygen and one of niobium and tantalum. As long as the tungsten bronze structure is maintained, each of the above elements may be replaced with the other elements. For example, K and Li may be partly replaced with Rb and Na, respectively. In this case, the ratio of replacement by Rb or Na may preferably be 10 atomic percent or lower with respect to 100 atomic percent of potassium or lithium. Further, Cr, or a dopant for laser oscillation such as a rare earth element such as Er, Yb and Nd may be added to the oxide.

The first raw material gas may contain a gas, such as a carrier gas, in addition to the first metal organic compound. Further, the second raw material gas may contain a gas, in addition to the second metal organic compound, such as a carrier gas. The carrier gas includes argon or nitrogen gases.

Sources for the metals constituting the oxide is not particularly limited. Metal organic compounds normally applicable in a metal organic chemical vapor deposition may be used. For example, pentaethoxy niobium [$Nb(OC_2H_5)_5$] is preferred as a source for niobium. Potassium dipivaloylmethanate ($K(C_{11}H_{19}O_2)$) is preferred as a source for potassium. Lithium dipivaloylmethanate ($Li(C_{11}H_{19}O_2)$) is preferred as a source for lithium. Magnesium bisacetylacetonate (Mg $(C_5H_7O_2)_2$) is preferred as a source for magnesium. The following compounds are further listed as raw materials.

A source for niobium:

Niobium tetradipivaloylmethanate ($Nb(C_{11}H_{19}O_2)_4$)

Niobium pentaisopropoxide $Nb(i-OC_8H_7)_5$)

Niobium pentamethoxide ($Nb(OCH_8)_5$).

Niobium pentanormalbuthoxide ($Nb(n-OC_4H_9)_5$)

A source for potassium:

Potassium tert-butoxide ($K(t-OCH_9)$)

Potassium acetylacetonate ($K(C_5H_7O_2)$)

A source for lithium:

Lithium acetylacetonate ($Li(C_5H_7O_2)$)

Lithium hexafluoroacetylacetonate $Li(C_5HF_6O_2)$

A source for magnesium:

Magnesium bis-dipivaloylmethanate ($Mg(C_{11}H_{19}O_2)_2$)

According to the present invention, oxygen gas is contacted with the first metal organic compound first to facilitate the decomposition of the first metal organic compound. The first and second metal organic compounds are normally selected so that the first compound has a decomposition temperature higher than that of the second compound.

In a preferred embodiment, the first metal organic compound is a β-diketone compound and the second metal organic compound is an alkoxide.

According to the present invention, the first raw material gas is supplied into the film forming chamber through a first supply hole, the second raw material gas is supplied in the chamber through a second supply hole, and oxygen gas is supplied into the chamber through a third supply hole. A plurality of first supply holes, or second supply holes, or third supply holes may be provided.

It is constructed that oxygen gas is contacted with the first raw material gas before oxygen gas contacts with the second supply gas in the film forming chamber. The method is not particularly limited. In an embodiment, a storage space is provided in the film forming chamber so that oxygen gas is contacted and mixed with the first raw material gas therein.

In a preferred embodiment, the first and third supply holes are provided so that a flow of oxygen gas is crossed to a flow of the first raw material gas in the chamber. Particularly preferably, the first and third supply holes are provided so that the longitudinal axis of the first supply hole is made perpendicular to that of the third supply hole. In this case, however, it is necessary that the first supply hole is provided at a position nearer to the third supply hole than the second supply hole.

Figure 2:
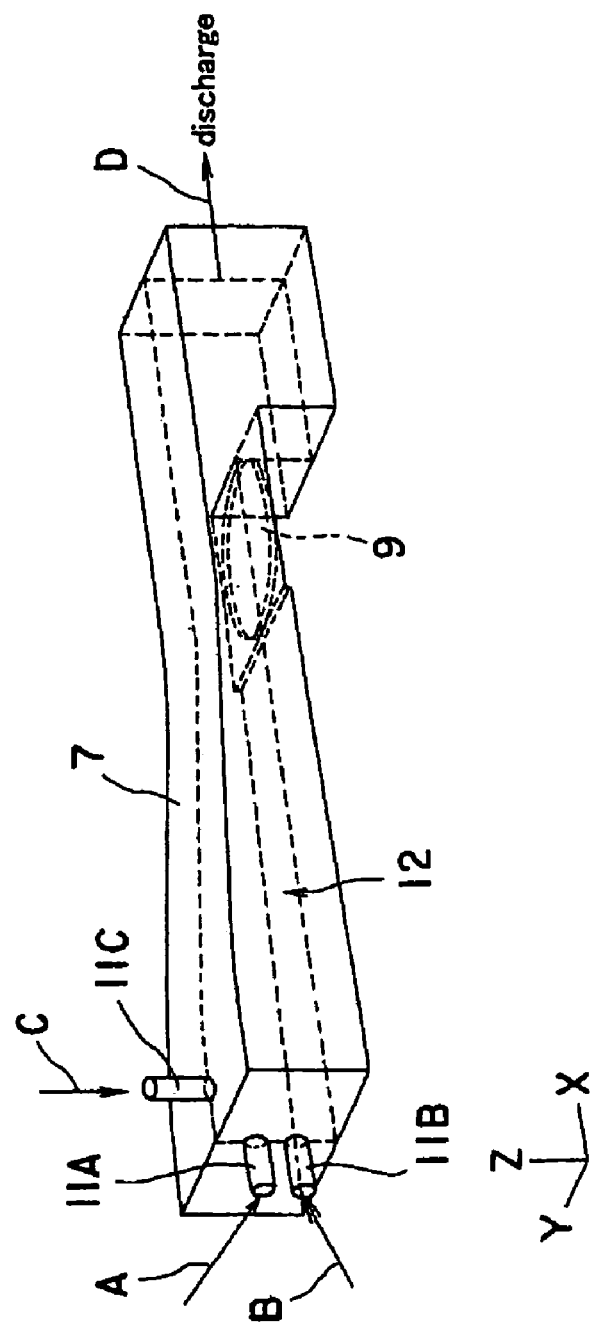
FIG. 2 is a perspective view schematically showing a film forming chamber 7.
Figure 3:
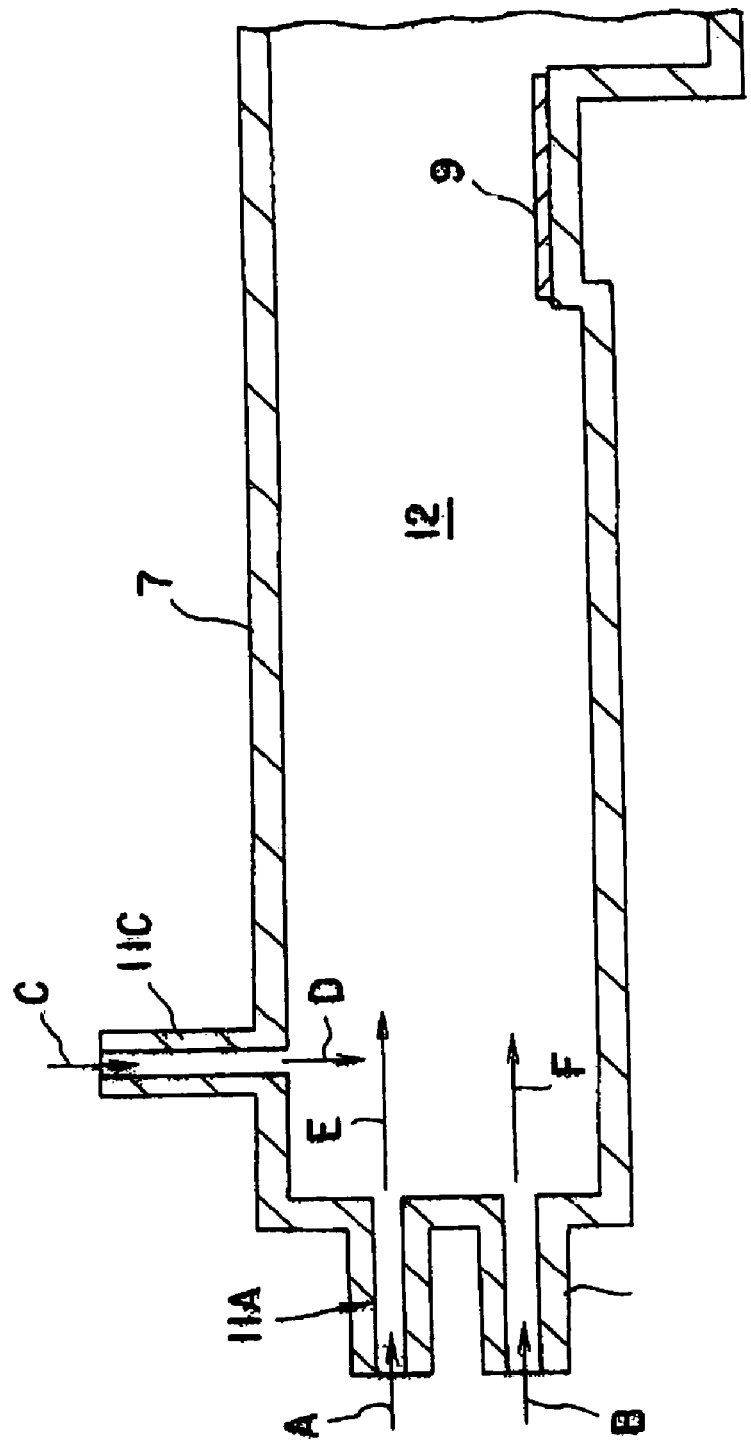
FIG. 3 is a cross sectional view schematically showing a film forming chamber 7.

FIGS. 1 to 3 mainly relates to this embodiment. FIG. 1 is a view schematically showing the whole of a film forming system according to the present example, FIG. 2 is a perspective view schematically showing the construction of a film forming chamber 7 and supply holes, and FIG. 3 is a cross sectional view schematically showing the shape of a film forming chamber 7 and supply holes.

The system has a bombe 1 for oxygen gas and a bombe 2 for a carrier gas such as argon. Oxygen gas is supplied from the bombe 1 for oxygen gas, passed through a mass-flow meter 3A and a valve, and then supplied into a space 12 in the film forming chamber 7 through a third supply hole 11C as an arrow "C".

Further, a carrier gas is supplied from a bombe 2 for carrier gas, passed through mass-flow meters 3B, 3C, 3D, 3E and valves, and supplied through supply holes 11B and 11C into the film forming chamber 7. In the present example, the carrier gas passed through the mass-flow meters 3B and 3C is mixed with the first metal organic compound supplied from sources 5B and 5C for first metal organic compound to generate a first raw material gas. The first raw material gas is supplied through a first supply hole 11A into the film forming chamber 7 as an arrow "A". The pressure of the carrier gas is monitored by pressure gauges 4B and 4C. The carrier gas passed through the mass-flow meters 3D and 3E is mixed with the second metal organic compound supplied from sources 5D and 5E for second metal organic compound to generate a second raw material gas. The second raw material gas is supplied through a second supply hole 11B into the film forming chamber 7 as an arrow "B". The pressure of the carrier gas is monitored by pressure gauges 4D and 4E.

The first raw material gas, second raw material gas and oxygen gas are heated at the corresponding appropriate temperatures direct before they are supplied into the supply holes, respectively.

The film forming chamber 7 is heated by a heater 6 and the pressure in the chamber 7 is monitored by a pressure gauge 4A. A target substrate 9 is set in the chamber 7 and the temperature of the substrate 9 is monitored by a thermocouple 8. Unnecessary gas is evacuated through RP 10 as an arrow "D".

As shown in FIGS. 2 and 3, the supply hole 11C for supplying oxygen gas is provided so that the longitudinal axis of the supply hole 11C is made substantially perpendicular to those of the first supply hole 11A and second supply hole 11B. At the same time, the first supply hole 11A is provided at a position nearer to the third supply hole 11C than the second supply hole 11B. Oxygen gas is flown into the chamber 7 as an arrow "C", and then flown in the space 12 as an arrow "D". The first raw material gas is flown into the space 12 through the first supply hole 11A as an arrow "A", then flown as an arrow "E", and contacted and mixed with oxygen gas (arrow "D"). Oxygen gas is further flown while mixed with the first raw material gas, and then mixed with the second raw material gas as an arrow "F". The thus mixed gases are then flown in the space 12 toward the substrate 9, so that a composite oxide is deposited on the substrate 9.

Since the first raw material gas contacts with oxygen gas before the second raw material gas contacts with oxygen gas in the space 12, the decomposition of the first raw material gas is enhanced. Such gas more difficult to decompose (having a higher decomposition temperature) is selected as the first raw material gas, the degree of decomposition of the first raw material gas is made similar to that of the second raw material gas. It is thus possible to improve the surface morphology of the oxide film and the quality of the film.

The oxide film and structure having the film according to the present invention may be used for applications not particularly limited, including a wavelength converting device, an optical modulating device, a surface acoustic wave device, an optical detection device and a piezoelectric vibrator.

The wavelength converting device is not limited to a second harmonic generation device, and includes third and fourth harmonic generation devices. Such wavelength converting device is particularly suitable for generating a short wavelength light having a wavelength of for example 390 nm to 470 nm. The device for generating such a short wavelength light can be preferably applied to various fields such as optical disc memory, medical science, photochemistry, various kinds of light measurements and so on.

The material for substrate 9 is not particularly limited and may preferably be those already listed for the oxide film. More preferably, the substrate 9 and the oxide film are made of the same kind of material. Alternatively, it is particularly preferred that the material of the substrate 9 is selected from the group consisting of lithium niobate, lithium tantalate, lithium niobate-lithium tantalate solid solution, potassium lithium niobate, potassium lithium tantalate, potassium lithium niobate-potassium lithium tantalate solid solution, potassium niobate and potassium niobate-potassium tantalate solid solution.

EXAMPLES

Example 1

A substrate having a thickness of 0.7 mm and made of a potassium lithium niobate-potassium lithium tantalite solid solution was produced according to micro pull-down process. The substrate had a composition of $K_3L_{1.85}(Nb_{0.95}Ta_{0.05})_{5.15}O_{15}$.

A film of a single crystal of potassium lithium niobate-potassium lithium tantalite solid solution was produced by metal organic vapor deposition according to the above procedure using the system shown in FIGS. 1 to 3.

Specifically, a reactor made of quartz glass was used. The reactor had a double wall structure, for air-tightness, having an outer tube and an inner tube (film forming chamber) 7 for flowing raw material gases, for air tight sealing. A table 8 for holding substrate was equipped substantially at the middle flow part in the space 12 of the film forming chamber 7. The substrate 9 was mounted on the table 8. A thermocouple 8 was mounted at the central part of the substrate 9 to monitor the temperature of the substrate 9. The supply holes 11A, 11B and 11C are provided at the upper flow parts of the film forming chamber 7.

Lithium dipivaloylmethanate ($Li(C_{11}H_{19}O_2)$) and potassium dipivaloylmethanate ($K(C_{11}H_{19}O_2)$) were used as the first metal organic compound. Niobium pentaethoxide ($Nb(OC_2H_5)_5$) was used as the second metal organic compound. A stainless steel container for lithium dipivaloylmethanate was connected in a constant temperature bath 5B, and a stainless steel container for potassium dipivaloylmethanate was connected in a constant temperature bath 5C. Stainless steel containers for niobium pentaethoxide were connected in constant temperature baths 5D and 5E. The raw material gases were supplied into the film forming chamber 7 under the following conditions.

TABLE 1

|  | Temperature (° C.) | Pressure (Torr) | Flow rate (sccm) |
|---|---|---|---|
| Lithium Dipivaloylmethane Li (DPM) | 188 | 10 | 80 |
| Potassium Dipivaloylmethane K (DPM) | 187 | 10 | 60 |
| Niobium pentaethoxide Nb (OEt)$_5$ | 118 | 160 | 250 |

Each raw material gas was flown through the corresponding pipe maintained at a temperature higher than the evapolation temperature of the metal organic compound by several tens ° C. to prevent the deposition of the compound. Specifically, the pipes for β-diketons (lithium dipivaloylmethanate, potassium dipivaloylmethanate) were maintained at about 230° C., the pipe for an alkoxide (niobium pentaethoxide) was maintained at about 200° C., and the pipe for oxygen gas was maintained at 250° C. Each raw material gas was introduced into the film forming chamber 7 using argon gas carries while the flow rate of the carrier was controlled. The pressure in the film forming chamber 7 was 10 Torr and the temperature of the substrate 9 was 780° C. The time period for the film formation was 4 hours.

Three samples were produced, and a film having superior surface morphology was obtained in each of three samples. The film thickness was measured by prism coupling method and proved to be 4.2 μm. The FWHM of X-ray rocking curve was measured for each of the substrates and films and the results were shown in table 2. As can be seen from the results, the present invention provides an oxide film having a crystal quality better than that of the underlying substrate.

TABLE 2

| Sample Number | Substrate 9 FWHM of X-ray rocking curve (arc sec) | Oxide film FWHM of X-ray rocking curve (arc sec) |
| --- | --- | --- |
| 1 | 84 | 74 |
| 2 | 65 | 59 |
| 3 | 81 | 53 |

Example 2

A film of a single crystal of potassium lithium niobate-potassium lithium tantalite solid solution was produced on the substrate 9 of the example 1 by metal organic vapor deposition according to the above procedure using the system shown in FIGS. 1 to 3.

Specifically, Z-cut and 3° off Y-cut lithium tantalate substrates each having a thickness of 0.5 mm were used as the substrate 9. The system described in the example 1 was used. Lithium dipivaloylmethanate ($Li(C_{11}H_{19}O_2)$) and magnesium bisacetylacetonate ($Mg(C_6H_7O_2)_2$) were used as the first metal organic compound. Niobium pentaethoxide ($Nb(OC_2H_5)_5$) was used as the second metal organic compound. A stainless steel container for lithium dipivaloylmethanate was connected in a constant temperature bath 5B, and a stainless steel container for potassium dipivaloylmethanate was connected in a constant temperature bath 5C. Stainless steel containers for niobium pentaethoxide were connected in constant temperature baths 5D and 5E. The raw materials gases were supplied into the film forming chamber 7 under the following conditions.

TABLE 3

| | Temperature (° C.) | Container Pressure (Torr) | Flow rate (sccm) |
| --- | --- | --- | --- |
| Lithium Dipivaloylmethane Li (DPM) | 188 | 10 | 80 |
| Magnesium bisacetylacetonate Mg (Acac)$_2$ | 100 | 10 | 60 |
| Niobium pentaethoxide Nb (OEt)$_5$ | 118 | 160 | 150 |

The pipes for β-diketons (lithium dipivaloylmethanate, Magnesium bisacetylacetonate) were maintained at about 230° C., the pipe for an alkoxide (niobium pentaethoxide) was maintained at about 200° C., and the pipe for oxygen gas was maintained at 250° C. Each raw material gas was introduced into the film forming chamber 7 using argon gas carrier while the flow rate of the carrier was controlled. The pressure in the film forming chamber 7 was 10 Torr and the temperature of the substrate 9 was 850° C. The time period for the film formation was 3 hours.

It was thus produced a thin film having a thickness of 1.5 μm and made of lithium niobate single crystal doped with MgO. The X-ray reciprocal lattice mapping of the film was measured to prove that the single crystal thin film was epitaxially grown on and along the lattices of the substrate 9. The refractive indices "$n_o$" and "$n_e$" of ordinary and extraordinary rays were measured and proved to be 2.2844 and 2.1908, respectively at a wavelength of 633 nm. The content of MgO was about 4 percent and a ratio of niobium to lithium (Nb/Li) was nearly stoichiometric.

Comparative Example 1

In the example 1, the pipes for the raw material gases were united outside of the film forming chamber 7 so that the raw material gases were mixed before introducing them into the chamber 7. The other conditions were the same as the example 1. An oxide film having good surface morphology was not obtained.

Comparative Example 2

In the example 2, the pipes for the raw material gases were united outside of the film forming chamber so that the raw material gases were mixed before introducing them into the chamber 7. The other conditions were the same as the example 2. An oxide film having good surface morphology was not obtained.

As described above, according to the present invention, an oxide film having good surface morphology and crystal quality can be made, when the film is produced by metal organic chemical vapor deposition using two or more gases of metal organic compounds and oxygen gas.

The present invention has been explained referring to the preferred embodiments, however, the present invention is not limited to the illustrated embodiments which are given by way of examples only, and may be carried out in various modes without departing from the scope of the invention.

The invention claimed is:

1. A method of producing a composite oxide film on a substrate by a metal organic chemical vapor deposition using a film forming system comprising a first supply hole, a second supply hole, a third supply hole and a film forming deposition chamber, said method comprising:

supplying a first raw material gas containing a first metal organic compound through said first supply hole into said deposition chamber, a second raw material gas containing a second metal organic compound through said second supply hole into said deposition chamber, and oxygen gas through said third supply hole into said deposition chamber to form a composite oxide film;

wherein said second organic metal compound has a decomposition temperature lower than that of said first organic metal compound, and wherein decomposition of said first raw material gas is initiated by contact with said oxygen gas before decomposition of said second raw material gas is initiated by contact with said oxygen gas in said deposition chamber.

2. The method of claim 1, wherein said first and third supply holes are provided so that a flow of said oxygen gas is crossed to a flow of said first raw material gas in said chamber.

3. The method of claim 2, wherein said first and third supply holes are elongated in directions substantially perpendicular to each other.

4. The method of claim 1, wherein said oxide film comprises a crystal having an electro-optic effect.

5. The method of claim 4, wherein said oxide is selected from the group consisting of lithium niobate, lithium tantalate, lithium niobate-lithium tantalate solid solution, potassium lithium niobate, potassium lithium tantalate and potassium lithium niobate-potassium lithium tantalate solid solution.

6. The method of claim 1, wherein said first metal organic compound comprises a β-diketone compound and said second metal organic compound comprises an alkoxide.

* * * * *